United States Patent [19]

Shou et al.

[11] Patent Number: 5,500,810
[45] Date of Patent: Mar. 19, 1996

[54] FILTER DEVICE WITH MEMORY TEST CIRCUIT

[75] Inventors: Guoliang Shou; Weikang Yang; Sunao Takatori; Makoto Yamamoto, all of Tokyo, Japan

[73] Assignees: Yozan Inc.; Sharp Corporation, both of Tokyo, Japan

[21] Appl. No.: 231,766

[22] Filed: Apr. 25, 1994

Related U.S. Application Data

[63] Continuation-in-part of Ser. No. 216,826, Mar. 23, 1994.

[30] Foreign Application Priority Data

Apr. 28, 1993 [JP] Japan ............................ 5-125078

[51] Int. Cl.⁶ .................................................. G06F 15/31
[52] U.S. Cl. ........................... 364/724.01; 364/724.16
[58] Field of Search ...................... 364/724.01, 724.16, 364/602; 341/100, 101

[56] References Cited

U.S. PATENT DOCUMENTS

| | | | |
|---|---|---|---|
| 4,701,956 | 10/1987 | Katoh | 364/724.13 |
| 4,766,563 | 8/1988 | Fujimoto | 364/724.16 |
| 5,034,907 | 7/1991 | Johnson et al. | 364/724.13 |
| 5,055,842 | 10/1991 | Mueller | 341/100 |
| 5,163,154 | 11/1992 | Bournas et al. | 364/736 |
| 5,235,538 | 8/1993 | Sumi et al. | 364/724.16 |
| 5,365,466 | 11/1994 | Hazard | 364/717 |

FOREIGN PATENT DOCUMENTS 0201628  11/1986  European Pat. Off. .

OTHER PUBLICATIONS

Massara, Robert E., "Synthesis of Low-Pass Forms", The Electrical Engineering Handbook, 1993, pp. 674–691.

*Primary Examiner*—Tan V. Mai
*Attorney, Agent, or Firm*—Cushman, Darby & Cushman

[57] ABSTRACT

A filter device with memory test circuit easily executes a memory test inspite of single-bit data processing to 1 bit data. The filter device with a memory test circuit includes a memory test circuit between a memory means and a shift register, sequentially reads digital data and tests digital data at the external Central Processing Unit (CPU) after converting the data from parallel to serial at the shift register.

4 Claims, 1 Drawing Sheet

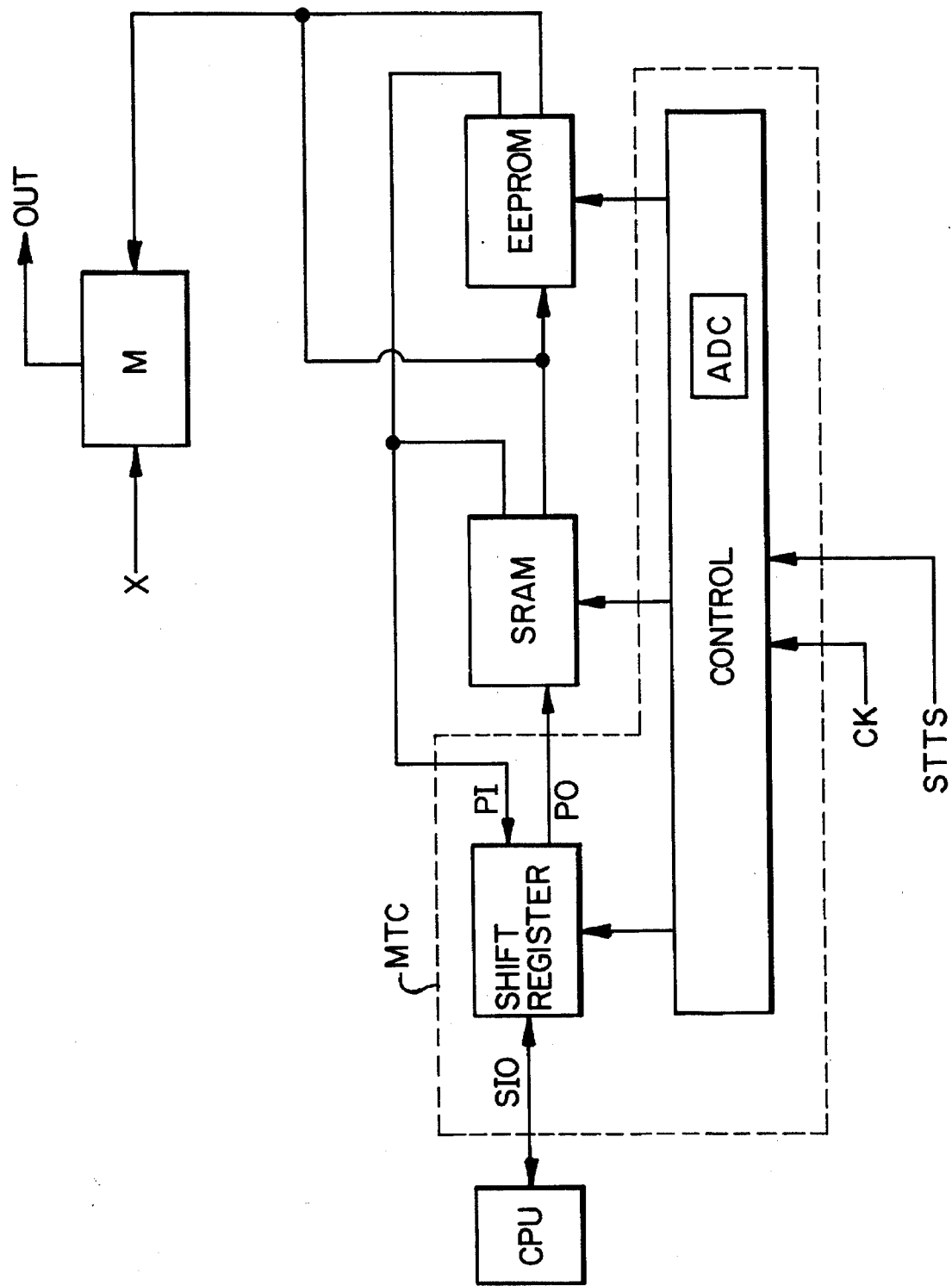

FILTER DEVICE WITH MEMORY TEST CIRCUIT

This is a continuation-in-part of application Ser. No. 08/216,826 filed on Mar. 23, 1994, pending.

FIELD OF THE INVENTION

The present invention relates to a filter device with a memory test circuit.

BACKGROUND OF THE INVENTION

In recent years, because of the exponential increase in the cost fine processing technology for digital computers, analog computers have been suggested. Where a stored conventional digital technology must be used, its is necessary to apply both digital processing and analog processing.

In a field of filters, circuits using analog data and circuits using digital data are known.

Analog circuits provide the benifits of; high speed processing, small size and low price. On the other hand, digital circuits provide the benifits of: easy change of configuration, and arrangement of but have the disadvantages of accuracy, large size and high cost.

The inventors of the present invention have filed an application for analog filter circuit of including a plurality of multiplication circuits connected in parrallel to input data. A plurality of multipliers are stored in a memory to which the multipliers are inputted through one bit pin of a filter device. This package design is advantageous for minimizing the size of device. To inspect the function of the memory, however, the test pins increase device size.

SUMMARY OF THE INVENTION

The present invention solves the conventional problems by providing a filter device with a memory test circuit which enables inspection and diagnostic testing of the memory through a single input/output data pin of the filter.

A filter device according to the present invention arranges includes a shift register for serially outputting memory data through the single pin to a memory test circuit such as a CPU. The memory includes a control circuit within the filter which successively generates memory addresses and designates a memory read mode.

BRIEF DESCRIPTION OF THE DRAWINGS

The single FIGURE is a block diagram showing an embodiment of a filter device with a memory test circuit according to the present invention.

PREFERRED EMBODIMENT OF THE PRESENT INVENTION

The single FIGURE shows a filter device which includes a plurality of serially connected multiplication circuits, one of which is representatively shown by reference M, for multiplying analog input signal X by a plurality of multipliers. A plurality of multipliers for the above multiplication are stored in a static random access memory SRAM and in an electrically erasable programmable read only memory EEPROM which are controlled by a control circuit CONTROL. The multipliers are stored as digital data so that the multipliers have high accuracy independently from the accuracy of the input data X. The control circuit generates addresses and controls the status of the SRAM and the EEPROM. A shift register SHIFT RGST is connected at its serial input/output SIO with an external circuit, in this case a CPU, for inspecting data held in the shift register. The shift register has a parallel input PI and a parallel output PO, such that data from the SRAM or EEPROM may be supplied to the shift register via PI and the data from the shift register may be supplied to the SRAM via PO.

The external circuit, in this case a CPU, is connected to one data pin, not shown, of the filter device, for providing multiplier data. The shift register converts serial data from the external circuit into parallel data from the SRAM, as well as converts parallel data from the SRAM into serial data for input to the external circuit. Therefore, data inspection is possible through one data pin. The multipliers are loaded into the SRAM every time the filter device is used, so CPU outside is indispensable for giving the data to SRAM.

Multipliers may be transferred between the SRAM and the EEPROM under the control of the control circuit. The data within the EEPROM or the SRAM may also be input to the shift register for inspection.

The control circuit has an address counter ADC for generating an address of the SRAM or the EEPROM. Clock signal CK is synchronous with the clock of the SRAM, the EEPROM, and the shift register for synchronous control of the memories and the shift register. A status signal STTS is supplied to the control circuit from an external source to control the read/write status of the memories.

Thus, memory test circuit MTC is constructed by the shift register and the control circuit. As described, the filter device with a memory test circuit according to the present invention includes a memory test circuit between a memory means and an external circuit which allows testing of digital data by an external CPU using only a single data pin after converting stored data from parallel to serial by means of a shift register. The filter device with memory test circuit thus allows an easily executed memory test.

What is claimed is:

1. A filter device comprising:

a multiplication circuit for multiplying input data by at least one of a plurality of multipliers;

a memory means for storing said plurality of multipliers;

a shift register having a single input/output data pin, said shift register being operatively connected to an external circuit via said single input/output data pin and operatively connected to said memory means, said shift register converting said multipliers between a parallel data format and a serial data format; and a control circuit for generating addresses of said memory means and for selecting a read/write status of said memory means.

2. A filter device as claimed in claim 1, wherein said memory means comprises a SRAM and a EEPROM.

3. A filter device as claimed in claim 1, wherein said control circuit includes an address counter for generating said address of said memory means.

4. A filter device comprising:

a plurality of multiplication circuits for multiplying analog data by digital multiplier data;

a SRAM for storing said digital multiplier data;

an EEPROM also storing said digital multiplier data; and a memory control circuit for controlling said SRAM and EEPROM, said memory control circuit including:

an address counter for generating addresses of said SRAM and said EEPROM;

a single input/output pin; and a shift register operatively connected to an external circuit via said single input/output pin, said shift register receiving said digital multiplier data from said SRAM or said EEPROM in a parallel format, converting said digital multiplier data from said parallel format to a serial format, and outputting said digital multiplier data to said external circuit in said serial format through said single input/output pin, said shift register also receiving said digital multiplier data from said external circuit through said single input/output pin in said serial format, converting said digital multiplier data from said serial format to said parallel format, and outputting said digital multiplier data in said parallel format to said SRAM.

* * * * *